United States Patent
Liu et al.

(10) Patent No.: US 12,457,885 B2
(45) Date of Patent: Oct. 28, 2025

(54) HOLLOWED BENDING STRUCTURE FOR DISPLAY DRIVER

(71) Applicants: Chengdu BOE Optoelectronics Technology Co., Ltd., Sichuan (CN); BOE TECHNOLOGY GROUP CO., LTD., Beijing (CN)

(72) Inventors: Xiaolin Liu, Beijing (CN); Yue Cui, Beijing (CN); Hong Zhu, Beijing (CN); Yuehan Wei, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 572 days.

(21) Appl. No.: 17/802,128

(22) PCT Filed: Oct. 26, 2021

(86) PCT No.: PCT/CN2021/126305
§ 371 (c)(1),
(2) Date: Aug. 24, 2022

(87) PCT Pub. No.: WO2022/179147
PCT Pub. Date: Sep. 1, 2022

(65) Prior Publication Data
US 2023/0172031 A1    Jun. 1, 2023

(30) Foreign Application Priority Data
Feb. 23, 2021 (CN) .......................... 202110203142.8

(51) Int. Cl.
*H10K 59/82* (2023.01)
*H01M 50/247* (2021.01)
(Continued)

(52) U.S. Cl.
CPC .......... *H10K 59/82* (2023.02); *H01M 50/247* (2021.01); *H10K 77/111* (2023.02); *H10K 2102/311* (2023.02)

(58) Field of Classification Search
CPC ................ H10K 59/82; H10K 77/111; H10K 2102/311; H10K 59/10; H01M 50/247; Y02E 10/549; G09F 9/301
See application file for complete search history.

(56) References Cited

U.S. PATENT DOCUMENTS

2015/0089974 A1    4/2015    Seo et al.
2016/0327987 A1    11/2016   Huitema et al.
(Continued)

FOREIGN PATENT DOCUMENTS

CN    104050884 A    9/2014
CN    205566405 U    9/2016
(Continued)

OTHER PUBLICATIONS

China Patent Office, CN202110203142.8, First Office Action, issued Jul. 1, 2022.

*Primary Examiner* — J. E. Schoenholtz
(74) *Attorney, Agent, or Firm* — HOUTTEMAN LAW LLC

(57) ABSTRACT

An display panel, including: a flexible display substrate; a circuit board on a back side of the flexible display substrate, wherein the circuit board is bonded and connected to the flexible display substrate, and is provided with a circuit device on a back side of the circuit board far away from the flexible display substrate; an auxiliary bending protection structure on the back side of the flexible display substrate, wherein the auxiliary bending protection structure is fixedly connected to the back side of the flexible display substrate, (Continued)

and the circuit device is in a region where the auxiliary bending protection structure is located.

18 Claims, 5 Drawing Sheets

(51) Int. Cl.
*H10K 77/10* (2023.01)
*H10K 102/00* (2023.01)

(56) References Cited

U.S. PATENT DOCUMENTS

| | | |
|---|---|---|
| 2018/0027651 A1 | 1/2018 | Lim et al. |
| 2018/0150112 A1* | 5/2018 | Aoki ................... G06F 1/1652 |
| 2018/0275722 A1* | 9/2018 | Lo ........................ H04M 1/02 |
| 2019/0259968 A1* | 8/2019 | Choi ................ H10K 59/8731 |
| 2020/0170106 A1 | 5/2020 | Wu |
| 2020/0404773 A1 | 12/2020 | Uogishi et al. |
| 2021/0405688 A1* | 12/2021 | Barrett ................ H10K 77/111 |
| 2022/0190264 A1* | 6/2022 | Yun ....................... H10K 59/12 |

FOREIGN PATENT DOCUMENTS

| | | |
|---|---|---|
| CN | 106030688 A | 10/2016 |
| CN | 107546252 A | 1/2018 |
| CN | 107734992 A | 2/2018 |
| CN | 108633198 A | 10/2018 |
| CN | 110277435 A | 9/2019 |
| CN | 110930881 A | 3/2020 |
| CN | 111509158 A | 8/2020 |
| CN | 112991946 A | 6/2021 |

* cited by examiner

HOLLOWED BENDING STRUCTURE FOR DISPLAY DRIVER

TECHNICAL FIELD

The embodiments of the present disclosure belong to the technical field of display, and particularly relate to a display panel and a display apparatus.

BACKGROUND

At present, a portable flexible display apparatus that is bendable, foldable and stretchable is becoming more and more popular. For example, a wristband mobile phone is not only convenient to be carried, but also enables the user to watch the display apparatus anytime and anywhere.

For example, in an OLED (an organic light-emitting diode) flexible display apparatus, circuit devices are usually arranged on a flexible circuit board and a peripheral circuit board, which are arranged on a back side of a display substrate in the OLED display apparatus. These circuit devices may be subjected to a great bending stress during a bending process of the OLED display apparatus, which may easily cause a risk of cracking of the circuit devices. If the circuit devices crack, a display quality of the OLED display apparatus may be seriously affected.

SUMMARY

The embodiments of the present disclosure provide a display panel and a display apparatus.

In a first aspect, an embodiment of the present disclosure provides a display panel, including:
  a flexible display substrate;
  a circuit board on a back side of the flexible display substrate, wherein the circuit board is bonded and connected to the flexible display substrate, and is provided with a circuit device on a back side of the circuit board away from the flexible display substrate; and
  an auxiliary bending protection structure on the back side of the flexible display substrate, wherein the auxiliary bending protection structure is fixedly connected to the back side of the flexible display substrate, and the circuit device is in a region where the auxiliary bending protection structure is located.

In some embodiments, the auxiliary bending protection structure includes a flexible backing and a structural member;
  the flexible backing is fixedly arranged on the back side of the flexible display substrate; the flexible backing has a first hollow therein, and the circuit board is exposed at the first hollow; and
  the structural member is on a side of the flexible backing away from the flexible display substrate, and is fixedly connected to the flexible backing; and the circuit device is in a region where the structural member is located.

In some embodiments, the structural member includes a plurality of sub-parts, which are sequentially arranged along a long side to be bent of the flexible display substrate; and
  each of the plurality of sub-part includes a first bump, a second bump and a connection piece, the first bump and the second bump are connected to two opposite ends of the connection piece, respectively, and the first bump, the second bump and the connection piece are arranged along a direction of a short side not to be bent of the flexible display substrate.

In some embodiments, the circuit device is in a region where the connection piece is located; and
  the connection piece has a plurality of second hollows therein, and the circuit device is exposed at the plurality of second hollows.

In some embodiments, the connection pieces of any two adjacent sub-parts are spaced apart from each other by a gap.

In some embodiments, the connection pieces of the plurality of sub-parts have an equal width, and the gaps between the connection pieces of any two adjacent sub-parts have an equal width.

In some embodiments, the connection pieces of the sub-parts arranged at two opposite ends and at a middle along the long side to be bent of the flexible display substrate are first connection pieces, the connection pieces of the sub-parts arranged at other positions are second connection pieces, a width of the first connection piece is greater than a width of the second connection piece, and the gaps between the connection pieces of any two adjacent sub-parts have an equal width; and
  the width of the connection piece is a dimension of the connection piece along an extending direction of the long side to be bent of the flexible display substrate.

In some embodiments, the connection piece is at least partially in contact with and connected to the flexible backing in a region where an orthographic projection of the connection piece on the flexible display substrate overlaps an orthographic projection of the flexible backing on the flexible display substrate.

In some embodiments, the circuit devices include a device of first height and a device of second height, a height of the device of first height is greater than a height of the device of second height; the connection piece includes a first thickness region and a second thickness region, and a thickness of the first thickness region is greater than a thickness of the second thickness region; a thickness of the connection piece is a dimension of the connection piece along a direction perpendicular to a plane where the connection piece is located;
  the device of first height is in the first thickness region, and a surface of the first thickness region of the connection piece away from the flexible backing is higher than a surface of the device of first height away from the flexible backing; and
  the device of second height is in the second thickness region, and a surface of the second thickness region of the connection piece away from the flexible backing is higher than a surface of the device of second height away from the flexible backing.

In some embodiments, the first bump and the second bump have a same shape, and a sectional shape of the first bump perpendicular to the flexible backing includes a trapezoid.

In some embodiments, the first bumps of the plurality of sub-parts are arranged along one long side to be bent of the flexible display substrate, and the second bumps of the plurality of sub-parts are arranged along the other long side to be bent of the flexible display substrate; the two long sides to be bent of the flexible display substrate are parallel to each other and are opposite to each other; and
  any two adjacent first bumps are in contact with each other, and any two adjacent second bumps are in contact with each other; or, any two adjacent first bumps are spaced apart from each other by a first distance, and any two adjacent second bumps are spaced apart from each other by a first distance.

In some embodiments, the display panel further includes a main board which is on a side of the structural member away from the flexible backing, wherein the main board is on the first connection piece at the middle along the long side to be bent of the flexible display substrate; and the main board is bonded and connected to the circuit board.

In some embodiments, the display panel further includes a battery which is on the side of the structural member away from the flexible backing;

wherein the battery includes a plurality of rigid energy storage units and flexible connection parts, each of the flexible connection parts is connected between two adjacent rigid energy storage units; and the plurality of rigid energy storage units are sequentially arranged on the second connection pieces which are arranged between each of the two opposite ends and the middle along the long side to be bent of the flexible display substrate, and are in a one-to-one correspondence with the second connection pieces.

In some embodiments, a material of the sub-part includes aluminum alloy.

In some embodiments, a material of the flexible backing includes stainless steel, and a thickness of the flexible backing is in a range of 0.1 mm to 0.15 mm.

In a second aspect, an embodiment of the present disclosure provides a display apparatus, including the above-described display panel.

BRIEF DESCRIPTION OF DRAWINGS

The drawings, which are included to provide a further understanding of the present disclosure and constitute a part of this specification, serve to explain the present disclosure together with the embodiments of the present disclosure, but do not constitute a limitation of the present disclosure. The above and other features and advantages will become more apparent to one of ordinary skill in the art by describing the specific exemplary embodiments with reference to the drawings. In the drawings.

REFERENCE NUMBERS ARE AS FOLLOWS

Figure 1:
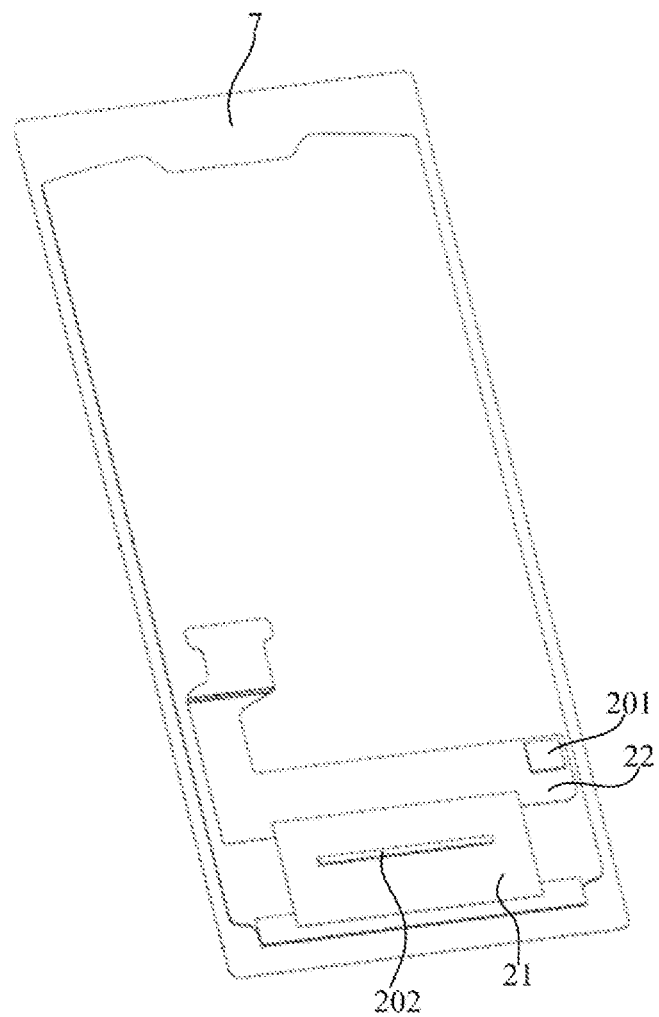
FIG. 1 is a schematic diagram illustrating a structure on a back side of an OLED flexible display substrate in the related art.

1. a flexible display substrate; 2. a circuit board; 20. a circuit device; 201. a touch driver chip; 202. a data driver chip; 21. a flexible circuit board; 22. a peripheral circuit board; 3. a flexible backing; 30. a first hollow; 4. a structural member; 40. a sub-part; 401. a first bump; 402. a second bump; 403. a connection piece; 4031. a second hollow; 4032. a first thickness region; 4033. a second thickness region; 5. a rigid energy storage unit; 6. a flexible connection part; 7. an OLED flexible display substrate.

DETAIL DESCRIPTION OF EMBODIMENTS

In order to enable one of ordinary skill in the art to better understand the technical solutions of the embodiments of the present disclosure, a display panel and a display apparatus provided in the embodiments of the present disclosure will be further described in detail with reference to the accompanying drawings and the detailed description below.

The embodiments of the present disclosure will be described more fully hereinafter with reference to the accompanying drawings, but the illustrated embodiments may be embodied in different forms and should not be construed as limited to the embodiments set forth herein. Rather, these embodiments are provided so that the present disclosure will be thorough and complete, and will fully convey the scope of the present disclosure to one of ordinary skill in the art.

The embodiments of the present disclosure are not limited to the embodiments shown in the drawings, but include modifications of configurations formed based on a manufacturing process. Accordingly, regions shown in the drawings are schematic, and shapes of the regions shown in the drawings illustrate specific shapes of the regions, but are not intended to be limiting.

Referring to FIG. 1, which is a schematic diagram of a back side of an OLED flexible display substrate. The back side of the OLED flexible display substrate refers to a side of the OLED flexible display substrate away from a display side of the OLED flexible display substrate. A lower end of the OLED flexible display substrate 7 is provided with a bonding area, and bonding connection terminals are provided in the boning area. One end of a flexible circuit board 21 is bonded and connected to the bonding connection terminals, and the other end of the flexible circuit board 21 is bent to the back of the OLED flexible display substrate 7 along with a bending of the flexible circuit board 21 and is bonded and connected to a peripheral circuit board 22 arranged on the back of the OLED flexible display substrate 7. The peripheral circuit board 22 is bonded and connected to a main board (not shown in the figure) through bonding connection terminals of the peripheral circuit board. A circuit device such as a touch driver chip 201 is arranged on the back of the peripheral circuit board 22 away from the OLED flexible display substrate 7, and a circuit device such as a data driver chip 202 is arranged on the back of the flexible circuit board 21 away from the OLED flexible display substrate 7. The main board provides control signals such as a touch drive control signal and a data drive control signal to the OLED flexible display substrate 7 through the peripheral circuit board 22 and the flexible circuit board 21, so as to control the OLED flexible display substrate 7 to perform normal touch and display.

The circuit devices such as the touch driver chip 201 and the data driver chip 202 may be easily subjected to a great bending stress during a bending process of the OLED flexible display substrate 7, resulting in cracking of the circuit devices, which seriously affects the display quality of the OLED flexible display substrate 7.

Figure 2:
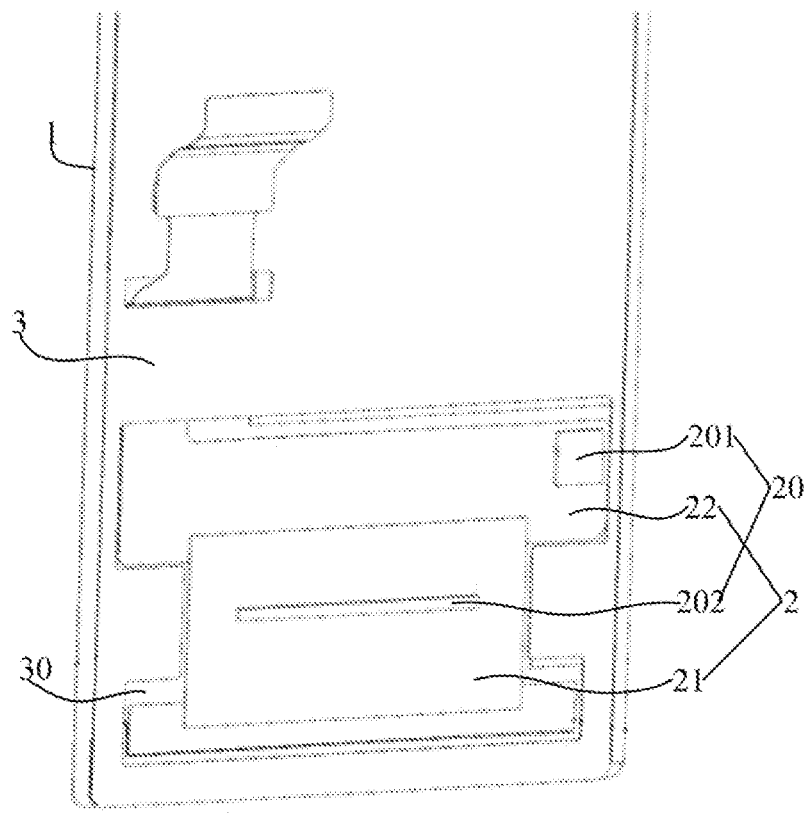
FIG. 2 is a schematic diagram illustrating a structure on a back side of a display panel provided with a flexible backing in an embodiment of the present disclosure.
Figure 3:
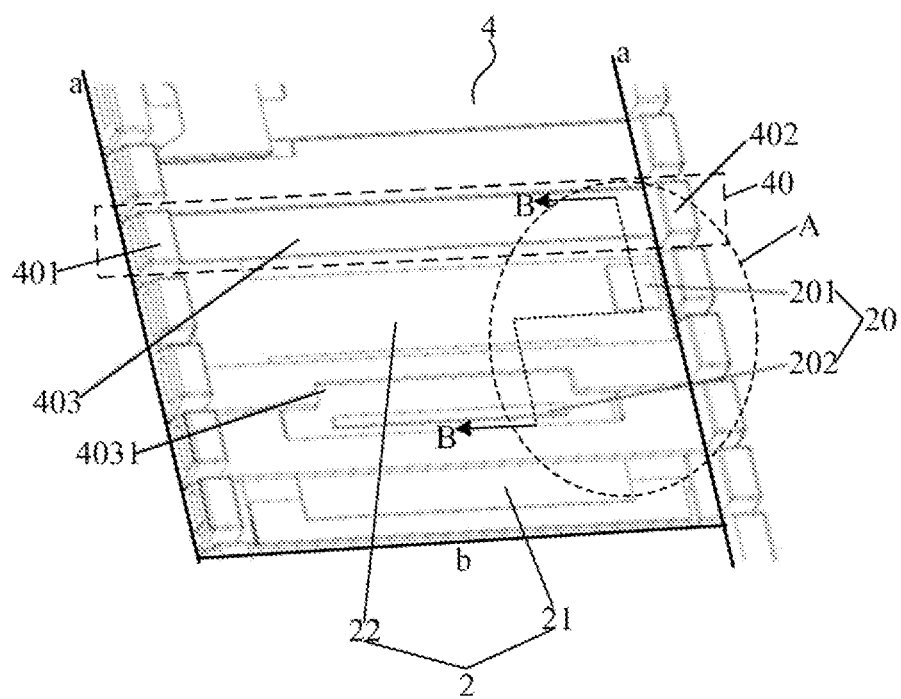
FIG. 3 is a schematic diagram illustrating a structure on a back side of a display panel provided with an auxiliary bending protection structure in an embodiment of the present disclosure.
Figure 4:
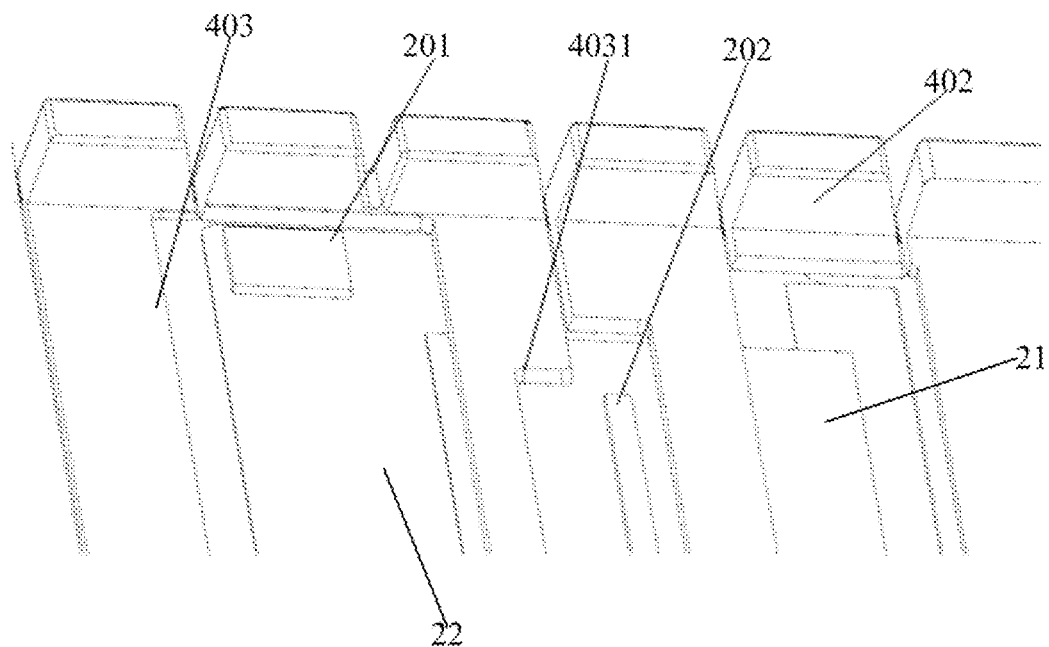
FIG. 4 is an enlarged schematic view illustrating a structure of a part A in FIG. 3.

Aiming at the problem that circuit devices of the OLED flexible display substrate are easily cracked and damaged during the bending process, an embodiment of the present disclosure provides a display panel, as shown in FIGS. 2 to 4, including: a flexible display substrate 1; a circuit board 2 arranged on a back side of the flexible display substrate 1, wherein the circuit board 2 is bonded and connected to the flexible display substrate 1, and a circuit device 20 is arranged on a back side of the circuit board 2 away from the flexible display substrate 1; and an auxiliary bending protection structure arranged on the back side of the flexible display substrate 1, wherein the auxiliary bending protection structure is fixedly connected to the back side of the flexible display substrate 1, and the circuit device 20 is located in a region where the auxiliary bending protection structure is located.

The back side of the flexible display substrate 1 refers to a side of the flexible display substrate 1 away from a display side of the flexible display substrate 1. On the one hand, the auxiliary bending protection structure may assist the flexible display substrate 1 to bend, and on the other hand, the auxiliary bending protection structure may further protect the circuit device 20 from bending stress substantially during the bending process of the flexible display substrate 1, thereby preventing the circuit device 20 from being cracked and damaged during the bending process, and ensuring that the display panel may realize not only a good bent shape but also a normal display performance.

In some embodiments, the circuit board 2 includes a flexible circuit board 21 and a peripheral circuit board 22. One end of the flexible circuit board 21 is bonded and connected to the bonding connection terminals arranged in a bonding area at one end of the flexible display substrate 1, and the other end of the flexible circuit board 21 is bent to the back side of the flexible display substrate 1 along with a bending of the flexible circuit board 21 and is bonded and connected to the peripheral circuit board 22 arranged on the back side of the flexible display substrate 1. The circuit device 20 includes a touch driver chip 201 arranged on a back side of the peripheral circuit board 22 away from the flexible display substrate 1 and a data driver chip 202 arranged on a back side of the flexible circuit board 21 away from the flexible display substrate 1. The circuit device 20 is easily cracked and damaged during the bending of the flexible display substrate 1. In some embodiments, the circuit device 20 is arranged on the flexible circuit board 21 and the peripheral circuit board 22 through a die attach process.

In some embodiments, the auxiliary bending protection structure includes a flexible backing 3 and a structural member 4. The flexible backing 3 is fixedly arranged on the back side of the flexible display substrate 1. A first hollow 30 is formed in the flexible backing 3, and the circuit board 2 is exposed at the first hollow 30. The structural member 4 is arranged on a side of the flexible backing 3 away from the flexible display substrate 1, and the structural member 4 is fixedly connected to the flexible backing 3. The circuit device 20 is located in a region where the structural member 4 is located. The flexible backing 3 is arranged to support the flexible display substrate 1 which is flexibly bent, and meanwhile, the flexible backing 3 fixedly arranged on the back side of the flexible display substrate 1 may serve as a stress neutral layer when the flexible display substrate 1 is bent, so that a tension and contraction relative displacement of the flexible display substrate 1, the circuit board 2 and the structural member 4, which are arranged on two sides of the flexible backing 3, respectively, is within an acceptable range when the flexible display substrate 1 is bent, ensuring that the whole display panel may realize a good bent shape. The first hollow 30 may prevent the flexible backing 3 from interfering or pressing and damaging the circuit board 2 on the back side of the flexible display substrate 1, where the flexible backing is arranged on the back side of the flexible display substrate 1.

In some embodiments, the flexible display substrate 1 is attached to the flexible backing 3 through a foam adhesive.

In some embodiments, the structural member 4 includes a plurality of sub-parts 40, and the sub-parts 40 are sequentially arranged along a long side a to be bent of the flexible display substrate 1. Each sub-part 40 includes a first bump 401, a second bump 402, and a connection piece 403. The first bump 401 and the second bump 402 are connected to two opposite ends of the connection piece 403, respectively. The first bump 401, the second bump 402, and the connection piece 403 are arranged along a short side b not to be bent of the flexible display substrate 1. With such an arrangement, when the flexible display substrate 1 is bent along the long side a to be bent, each sub-part 40 will not bend along with the bending of the flexible display substrate 1, so that the circuit device 20 located in the region where the structural member 4 is located will not bend along with the bending of the flexible display substrate 1, ensuring that the circuit device 20 will not be subjected to a great bending stress during the bending of the flexible display substrate 1, and preventing the circuit device 20 from being cracked and damaged during the bending of the flexible display substrate 1.

In some embodiments, the circuit device 20 is located in a region where the connection piece 403 is located. A plurality of second hollows 4031 are formed in the connection piece 403, and the circuit device 20 is exposed at the second hollow 4031. The second hollow 4031 may prevent the connection piece 403 from interfering or pressing and damaging the circuit device 20 on the back side of the flexible display substrate 1, where the connection piece 403 is arranged on the back side of the flexible display substrate 1.

Figure 5:
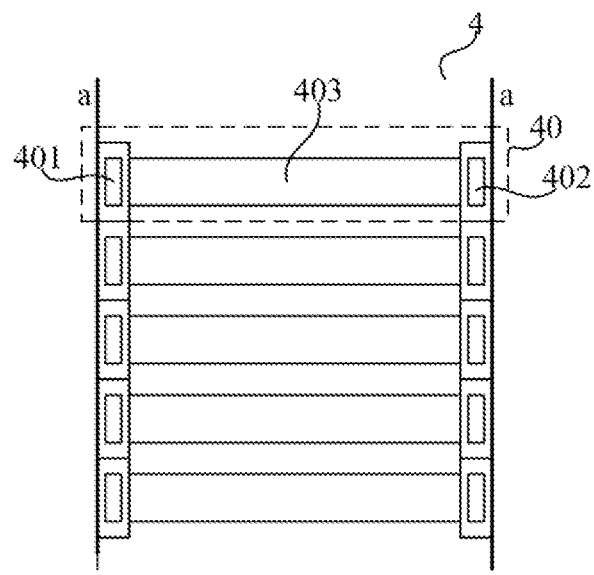
FIG. 5 is a schematic top view illustrating a structure of a structural member in an embodiment of the present disclosure.

In some embodiments, as shown in FIG. 5, the connection pieces 403 of any two adjacent sub-parts 40 are spaced apart from each other to form a gap. When the flexible display substrate 1 is bent along the long side a to be bent, the gap enables any two adjacent sub-parts 40 to be arranged along a bending direction of the flexible display substrate 1, and prevents the sub-part 40 itself from bending along with the bending of the flexible display substrate 1.

In some embodiments, the connection pieces 403 of the plurality of sub-parts 40 have an equal width, and the gaps between connection pieces 403 of any two adjacent sub-parts 40 have an equal width. With such an arrangement, it may facilitate a more even flexible bending of the flexible display substrate 1, which is convenient for the flexible display substrate 1 to form a more symmetrical arc shape through the bending of the flexible display substrate 1.

In some embodiments, the connection piece 403 is at least partially in contact with and is connected to the flexible backing 3 in a region where an orthographic projection of the connection piece 403 on the flexible display substrate 1 overlaps an orthographic projection of the flexible backing 3 on the flexible display substrate 1. Except the second hollow 4031, a whole surface of the connection piece 403 is arranged on the back side of the flexible backing 3 and in contact with the back side of the flexible backing 3. In some embodiments, the connection pieces 403 and the flexible backing 3 are adhered together through an adhesive or fixedly connected together by a mechanical connector such as a screw, thereby achieving a fixed connection between the sub-parts 40 and the flexible backing 3, so that the whole structural member 4 and the flexible backing 3 are integrated, so as to achieve an auxiliary bending for the flexible display substrate 1 and prevent the circuit devices 20 on the back side of the flexible display substrate 1 from being cracked and damaged.

Figure 6:
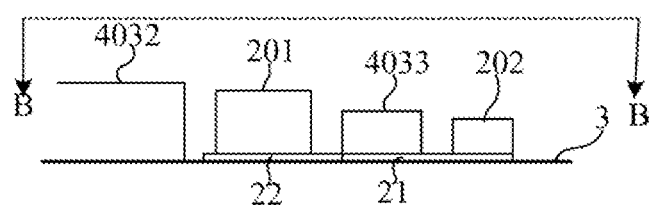
FIG. 6 is a schematic sectional view illustrating a structure of the display panel taken along a line BB in FIG. 3.

In some embodiments, as shown in FIG. 6, the circuit device 20 includes a device of first height and a device of second height, and a height of the device of first height is greater than a height of the device of second height. The height of the device of first height refers to a dimension of the device of first height in a direction perpendicular to a plane where the connection piece 403 is located. The height of the device of second height refers to a dimension of the device of second height in the direction perpendicular to the plane where the connection piece 403 is located. The connection piece 403 includes a first thickness region 4032 and a second thickness region 4033, and a thickness of the first thickness region 4032 is greater than a thickness of the second thickness region 4033. A thickness of the connection piece 403 is a dimension of the connection piece 403 in the direction perpendicular to the plane where the connection piece is located. The device of first height is located in the first thickness region 4032, and a surface of the first thickness region 4032 of the connection piece 403 away from the flexible backing 3 is higher than a surface of the device of first height away from the flexible backing 3. The device of second height is located in the second thickness region 4033, and a surface of the second thickness region 4033 of the connection piece 403 away from the flexible backing 3 is higher than a surface of the device of second height away from the flexible backing 3. That is, the circuit devices 20 on the circuit board 2 have different heights, and the above-described regions of different thicknesses of the connection piece 403 may support other circuit structures arranged on the back side of the connection piece 403, thereby preventing the circuit devices 20 of different heights correspondingly located in the regions of different thicknesses from being pressed and damaged. The device of first height is, for example, the touch driver chip 201, and the device of second height is, for example, the data driver chip 202.

Here, the first thickness region 4032 and the second thickness region 4033 of the connection piece 403 indicate that the connection piece 403 has a plurality of regions of different thicknesses, which is not limited to two regions of different thicknesses. The circuit devices 20 are also not limited to two circuit devices 20 of different heights, and may represent a plurality of circuit devices 20 of different heights.

Figure 7:
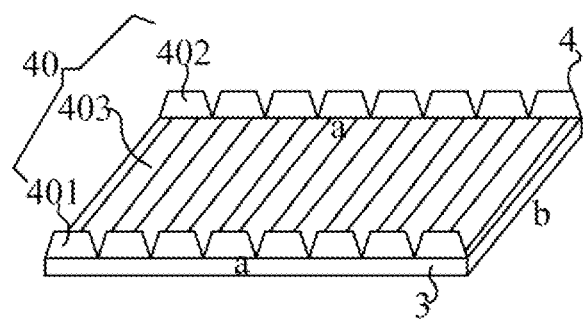
FIG. 7 is a schematic diagram illustrating an arrangement of first bumps and second bumps in an embodiment of the present disclosure.

In some embodiments, as shown in FIG. 7, the first bump 401 and the second bump 402 are identical in shape, and a sectional shape of the first bump 401 perpendicular to the flexible backing 3 includes a trapezoid.

In some embodiments, the first bumps 401 of the plurality of sub-parts 40 are arranged along one long side a to be bent of the flexible display substrate 1 and the second bumps 402 of the plurality of sub-parts 40 are arranged along the other long side a to be bent of the flexible display substrate 1. The two long sides a to be bent of the flexible display substrate 1 are parallel to each other and are arranged opposite to each other. Any two adjacent first bumps 401 are in contact with each other, and any two adjacent second bumps 402 are in contact with each other.

The trapezoid is in a shape with a wider bottom and a narrower top, so that a gap is formed between the narrower tops of any two adjacent first bumps 401, and a gap is formed between the narrower tops of any two adjacent second bumps 402. When the flexible display substrate 1 is bent along the long side a thereof, the gap between the narrower tops of any two adjacent first bumps 401 is reduced, and the gap between the narrower tops of any two adjacent second bumps 402 is also reduced, so that the sub-parts 40 may assist the bending of the flexible display substrate 1, and further the entire structural member 4 may assist the bending of the flexible display substrate 1.

Figure 8:
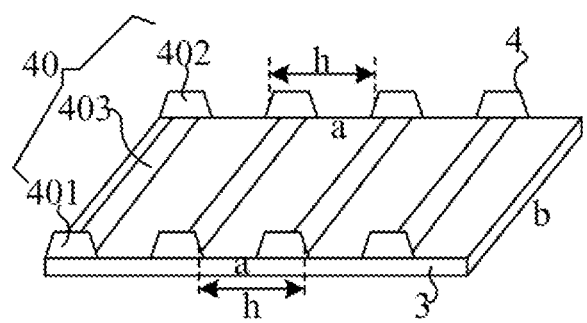
FIG. 8 is a schematic diagram illustrating another arrangement of first bumps and second bumps in an embodiment of the present disclosure.

In some embodiments, as shown in FIG. 8, any two adjacent first bumps 401 are spaced apart from each other by a first distance h, and any two adjacent second bumps 402 are spaced apart from each other by the first distance h. When the flexible display substrate 1 is bent along the long side a thereof, positions of any two adjacent first bumps 401 are changed along with the bending of the flexible display substrate 1 through a gap of the first distance h between the any two adjacent first bumps 401; positions of any two adjacent second bumps 402 are changed along with the bending of the flexible display substrate 1 through a gap of the first distance h between the any two adjacent second bumps 402. Since the first bump 401 and the second bump 402 are not bent and hardly subjected to a bending stress, each sub-part 40 may assist the bending of the flexible display substrate 1, and further the whole structural member 4 may assist the bending of the flexible display substrate 1.

In some embodiments, a material of the sub-part 40 includes aluminum alloy. That is, the sub-part 40 is a rigid member.

In some embodiments, a material of the flexible backing 3 includes stainless steel, and a thickness of the flexible backing 3 is in a range of 0.1 mm to 0.15 mm. The flexible backing 3 having such the thickness and made of stainless steel may be flexibly bent, thereby assisting the flexible display substrate 1 to be flexibly bent.

In some embodiments, the display panel further includes a main board (not shown), which is located on a side of the structural member 4 away from the flexible backing 3, and is arranged on any one of the connection pieces 403. The main board is bonded and connected to the circuit board 2. The main board provides control signals such as a touch drive control signal and a data drive control signal to the flexible display substrate 1 through the peripheral circuit board 22 and the flexible circuit board 21, so as to control the flexible display substrate 1 to perform normal touch and display. The main board is arranged on any one of the connection pieces 403, so that since the connection piece 403 is not bent when the flexible display substrate 1 is bent, the main board may be protected from a greater bending stress, thereby ensuring a good circuit performance of the main board.

Figure 9:
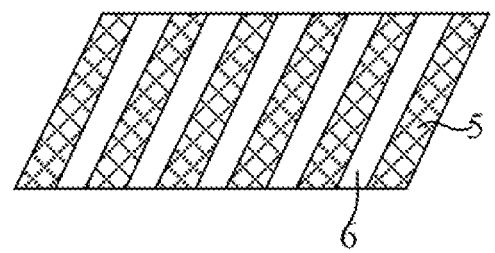
FIG. 9 is a schematic diagram illustrating a structure of a battery in an embodiment of the present disclosure.

In some embodiments, the display panel further includes a battery (not shown in the figures) located on the side of the structural member 4 away from the flexible backing 3. As shown in FIG. 9, the battery includes a plurality of rigid energy storage units 5 and flexible connection parts 6, each of which is connected between two adjacent rigid energy storage units 5. The plurality of rigid energy storage units 5 are sequentially arranged on the plurality of connection pieces 403 which are continuously arranged, and are in a one-to-one correspondence with the plurality of connection pieces 403. The flexible connection part 6 may be made of a flexible film material such as a polyimide material. A structure of each rigid energy storage unit 5 is that of a conventional battery, and the rigid energy storage unit 5 is used for providing power for display and control of the flexible display substrate 1. The rigid energy storage units 5 may be electrically connected in series through the flexible connection parts 6, so that the capacity of the overall battery may meet the requirements of providing power to the flexible display substrate 1. The plurality of rigid energy storage units 5 are arranged on the plurality of connection pieces 403, which are continuously arranged, in a one-to-one correspondence, so that since the connection pieces 403 are not bent when the flexible display substrate 1 is bent, the rigid energy storage units 5 may be protected from a greater bending stress, thereby ensuring a good circuit performance of the battery.

Figure 10:
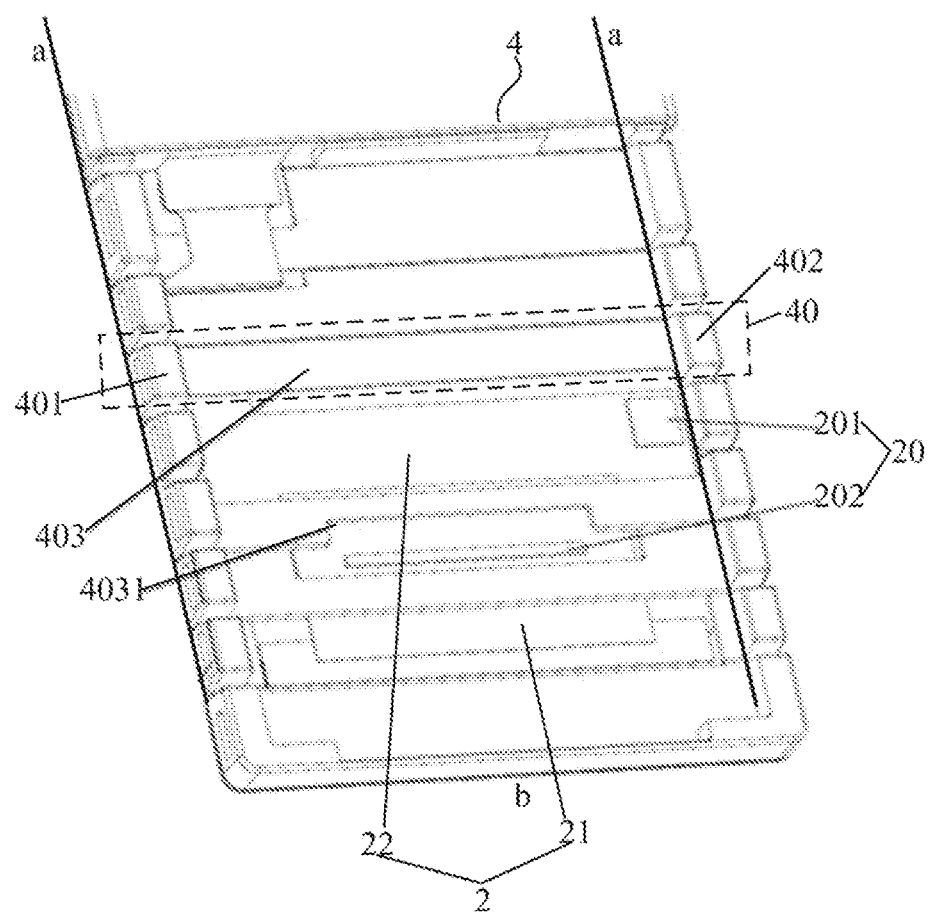
FIG. 10 is a schematic diagram illustrating another structure on a back side of a display panel provided with an auxiliary bending protection structure in an embodiment of the present disclosure.
Figure 11:
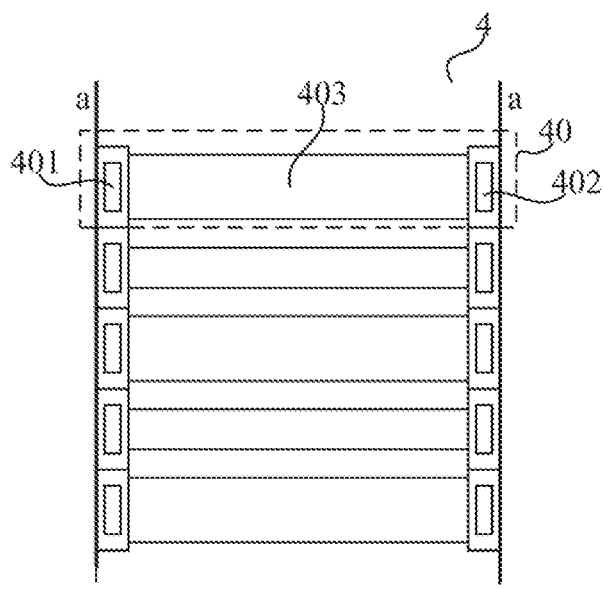
FIG. 11 is a schematic top view of another structure of a structural member in an embodiment of the present disclosure.

An embodiment of the present disclosure further provides a display panel, which is different from that in the above embodiments in that, as shown in FIGS. 10 and 11, the connection pieces 403 of the sub-parts 40 arranged at two opposite ends and at a middle along the long side a to be bent of the flexible display substrate are first connection pieces, the connection pieces 403 of the sub-parts 40 arranged at other positions are second connection pieces, a width of the first connection piece is greater than that of the second connection piece, and widths of gaps between the connection pieces 403 of any two adjacent sub-parts 40 are equal. The width of the connection piece 403 is a dimension of the connection piece 403 along an extending direction of the long side a to be bent of the flexible display substrate.

The widths of gaps between the connection pieces 403 of any two adjacent sub-parts 40 are equal, so that it may facilitate a more even flexible bending of the flexible display substrate, which is convenient for the flexible display substrate 1 to form a more symmetrical arc shape through the bending of the flexible display substrate 1. The first connection pieces arranged at the two ends and at the middle along the long side a to be bent of the flexible display substrate is set to be wider, so that other circuit devices (such as the main board, the battery and the like), which are arranged on the back side of the first connection piece, cannot be subjected to a larger bending stress in the bending process of the flexible display substrate, and are wider, may be arranged on this first connection piece with a wider width. Since the connection piece 403 is not bent during the bending process of the flexible display substrate, the circuit devices may be protected from a greater bending stress, thereby ensuring a good circuit performance of the circuit devices.

In some embodiments, the main board (not shown) is located on a side of the structural member 4 away from the flexible backing, and the main board is arranged on the first connection piece arranged at the middle along the long side a to be bent of the flexible display substrate. The main board is bonded and connected to the circuit board 2. The main board is wide, and the main board is arranged on one first connection piece in the middle, so that since the connection piece 403 is not bent when the flexible display substrate is bent, the main board may be protected from a greater bending stress, ensuring a good circuit performance of the main board.

In some embodiments, the battery (not shown) is located on the side of the structural member 4 away from the flexible backing. The battery includes a plurality of rigid energy storage units and flexible connection parts, each of which is connected between two adjacent rigid energy storage units. The rigid energy storage units are sequentially arranged on the second connection pieces which are arranged between each of the two ends and the middle position along the long side a to be bent of the flexible display substrate, and are in a one-to-one correspondence with the second connection pieces. The rigid energy storage unit has a less width, therefor is arranged on the second connection piece with the less width. Since the connection piece 403 is not bent when the flexible display substrate is bent, the rigid energy storage unit may be protected from a larger bending stress, ensuring a good circuit performance of the battery.

Other structures of the display panel in the embodiment of the present disclosure are the same as those in the embodiments described above, and are not repeated herein.

In the display panel provided in the above-described embodiments, the auxiliary bending protection structure is provided, which may, on the one hand, assist the flexible display substrate to bend, and on the other hand, further protect the circuit device from the bending stress substantially during the bending process of the flexible display substrate, thereby preventing the circuit device from being cracked and damaged during the bending process, and ensuring that the display panel may realize not only a good bent shape but also a normal display performance.

An embodiment of the present disclosure further provides a display apparatus, which includes the display panel in any one of the above embodiments.

By adopting the display panel in any one of the above embodiments, not only a good flexible bending performance of the display apparatus, but also a normal display performance of the display apparatus may be ensured.

The display apparatus provided by the embodiments of the present disclosure may be any product or component with a display function, such as an OLED panel, an OLED television, a monitor, a mobile phone, a navigator or the like.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications are to be considered within the scope of the present disclosure.

What is claimed is:

1. A display panel, comprising:
   a flexible display substrate;
   a circuit board on a back side of the flexible display substrate, wherein the circuit board is bonded and connected to the flexible display substrate, and is provided with a circuit device on a back side of the circuit board away from the flexible display substrate; and
   an auxiliary bending protection structure on the back side of the flexible display substrate, wherein the auxiliary bending protection structure is fixedly connected to the back side of the flexible display substrate, and the circuit device is in a region where the auxiliary bending protection structure is located,
   wherein the auxiliary bending protection structure comprises a flexible backing and a structural member;
   the flexible backing is fixedly arranged on the back side of the flexible display substrate; the flexible backing has a first hollow therein, and the circuit board is exposed at the first hollow; and the structural member is on a side of the flexible backing away from the flexible display substrate, and is fixedly connected to the flexible backing; and the circuit device is in a region where the structural member is located.

2. The display panel according to claim 1, wherein the structural member comprises a plurality of sub-parts, which are sequentially arranged along a long side to be bent of the flexible display substrate; and each of the plurality of sub-part comprises a first bump, a second bump and a connection piece, the first bump and the second bump are connected to two opposite ends of the connection piece, respectively, and the first bump, the second bump and the connection piece are arranged along a direction of a short side not to be bent of the flexible display substrate.

3. The display panel according to claim 2, wherein the circuit device is in a region where the connection piece is located; and the connection piece has a plurality of second hollows therein, and the circuit device is exposed at the plurality of second hollows.

4. The display panel according to claim 3, wherein the connection pieces of any two adjacent sub-parts are spaced apart from each other by a gap.

5. The display panel according to claim 4, wherein the connection pieces of the plurality of sub-parts have an equal width, and the gaps between the connection pieces of any two adjacent sub-parts have an equal width.

6. The display panel according to claim 4, wherein the connection pieces of the sub-parts arranged at two opposite ends and at a middle along the long side to be bent of the flexible display substrate are first connection pieces, the connection pieces of the sub-parts arranged at other positions are second connection pieces, a width of the first connection piece is greater than a width of the second connection piece, and the gaps between the connection pieces of any two adjacent sub-parts have an equal width; and the width of the connection piece is a dimension of the connection piece along an extending direction of the long side to be bent of the flexible display substrate.

7. The display panel according to claim 3, wherein the connection piece is at least partially in contact with and connected to the flexible backing in a region where an orthographic projection of the connection piece on the flexible display substrate overlaps an orthographic projection of the flexible backing on the flexible display substrate.

8. The display panel according to claim 7, wherein the circuit devices comprise a device of first height and a device of second height, a height of the device of first height is greater than a height of the device of second height; the connection piece comprises a first thickness region and a second thickness region, and a thickness of the first thickness region is greater than a thickness of the second thickness region; a thickness of the connection piece is a dimension of the connection piece along a direction perpendicular to a plane where the connection piece is located;

the device of first height is in the first thickness region, and a surface of the first thickness region of the connection piece away from the flexible backing is higher than a surface of the device of first height away from the flexible backing; and the device of second height is in the second thickness region, and a surface of the second thickness region of the connection piece away from the flexible backing is higher than a surface of the device of second height away from the flexible backing.

9. The display panel according to claim 2, wherein the first bump and the second bump have a same shape, and a sectional shape of the first bump perpendicular to the flexible backing comprises a trapezoid.

10. The display panel according to claim 9, wherein the first bumps of the plurality of sub-parts are arranged along one long side to be bent of the flexible display substrate, and the second bumps of the plurality of sub-parts are arranged along the other long side to be bent of the flexible display substrate; the two long sides to be bent of the flexible display substrate are parallel to each other and are opposite to each other; and any two adjacent first bumps are in contact with each other, and any two adjacent second bumps are in contact with each other; or, any two adjacent first bumps are spaced apart from each other by a first distance, and any two adjacent second bumps are spaced apart from each other by a first distance.

11. The display panel according to claim 6, further comprising a main board on a side of the structural member away from the flexible backing, wherein the main board is on the first connection piece at the middle along the long side to be bent of the flexible display substrate; and the main board is bonded and connected to the circuit board.

12. The display panel according to claim 11, further comprising a battery on the side of the structural member away from the flexible backing;

wherein the battery comprises a plurality of rigid energy storage units and flexible connection parts, each of the flexible connection parts is connected between two adjacent rigid energy storage units; and the plurality of rigid energy storage units are sequentially arranged on the second connection pieces which are arranged between each of the two opposite ends and the middle along the long side to be bent of the flexible display substrate, and are in a one-to-one correspondence with the second connection pieces.

13. The display panel according to claim 2, wherein a material of the sub-part comprises aluminum alloy.

14. The display panel according to claim 1, wherein a material of the flexible backing comprises stainless steel, and a thickness of the flexible backing is in a range of 0.1 mm to 0.15 mm.

15. A display apparatus, comprising the display panel according to claim 1.

16. The display apparatus according to claim 15, wherein the structural member comprises a plurality of sub-parts, which are sequentially arranged along a long side to be bent of the flexible display substrate; and each of the plurality of sub-part comprises a first bump, a second bump and a connection piece, the first bump and the second bump are connected to two opposite ends of the connection piece, respectively, and the first bump, the second bump and the connection piece are arranged along a direction of a short side not to be bent of the flexible display substrate.

17. The display apparatus according to claim 16, wherein the circuit device is in a region where the connection piece is located; and the connection piece has a plurality of second hollows therein, and the circuit device is exposed at the plurality of second hollows.

18. The display apparatus according to claim 17, wherein the connection pieces of any two adjacent sub-parts are spaced apart from each other by a gap.

\* \* \* \* \*